United States Patent
Huang et al.

(10) Patent No.: US 7,253,531 B1
(45) Date of Patent: Aug. 7, 2007

(54) SEMICONDUCTOR BONDING PAD STRUCTURE

(75) Inventors: Tai-Chun Huang, Hinchu (TW); Chih-Hsiang Yao, Taipei (TW); Kuan-Shou Chi, Taichung (TW); Ming-Ta Lei, Hsinchu (TW); Chin-Chiu Hsia, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/432,373

(22) Filed: May 12, 2006

(51) Int. Cl.
H01L 23/48 (2006.01)
H01L 23/52 (2006.01)
H01L 29/40 (2006.01)
H01L 23/28 (2006.01)

(52) U.S. Cl. ...................... 257/784; 257/786
(58) Field of Classification Search ............... 257/784, 257/786, 758, 781
See application file for complete search history.

(56) References Cited

U.S. PATENT DOCUMENTS

| | | | |
|---|---|---|---|
| 6,560,862 B1 * | 5/2003 | Chen et al. | 29/843 |
| 6,900,541 B1 * | 5/2005 | Wang et al. | 257/758 |
| 7,115,985 B2 * | 10/2006 | Antol et al. | 257/700 |
| 2005/0116345 A1 * | 6/2005 | Murtuza | 257/758 |
| 2005/0258549 A1 * | 11/2005 | Mathew | 257/779 |
| 2006/0071350 A1 * | 4/2006 | Fan et al. | 257/784 |
| 2006/0154469 A1 * | 7/2006 | Hess et al. | 438/618 |
| 2006/0154470 A1 * | 7/2006 | Pozder et al. | 438/618 |

* cited by examiner

Primary Examiner—S. V. Clark
(74) Attorney, Agent, or Firm—Birch, Stewart, Kolasch & Birch, LLP (57) ABSTRACT

The invention provides a bonding pad structure. At least one lower circuit layer is disposed overlying the substrate, wherein the lower circuit layer is a layout of circuit under pad. A top circuit layer is disposed overlying the lower circuit layer, wherein the top circuit layer comprises a top interconnect dielectric layer and a top interconnect pattern in the top interconnect dielectric layer. A top connecting layer is disposed overlying the top circuit layer, electrically connecting the top interconnect pattern. A top pad layer is disposed overlying the top connecting layer. A bonding ball is disposed overlying the top pad layer, wherein sides of the top interconnect pattern do not overlap a region extending inwardly and outwardly from a boundary of the bonding ball within distance of about 2.5μm.

20 Claims, 9 Drawing Sheets

SEMICONDUCTOR BONDING PAD STRUCTURE

BACKGROUND OF THE INVENTION

1. Field of the Invention

The invention relates to a semiconductor device, and more particularly to a bonding pad structure of semiconductor device.

2. Description of the Related Art

Semiconductor devices are used in many electronic applications, such as radios, televisions, cell phones and computers, as examples. Semiconductor devices are often fabricated as integrated circuits, with hundreds or thousands of devices often being manufactured on a single chip.

After a semiconductor device or integrated circuit has been fabricated, electrical connections must be made to the semiconductor device in order to connect it to other electronic components. This is usually accomplished by, after attaching the device to a package substrate or lead frame, making electrical connection between the bond pads of the device and the inner leads of the package, and the package leads are connected to pins located on the exterior of the package.

Wire bonding is typically carried out after the integrated circuit is attached to a package. Flexible wires are usually attached one at a time to bond pads on the integrated circuit, and the other end of the flexible wire is attached to a contact on the package.

Figure 1:
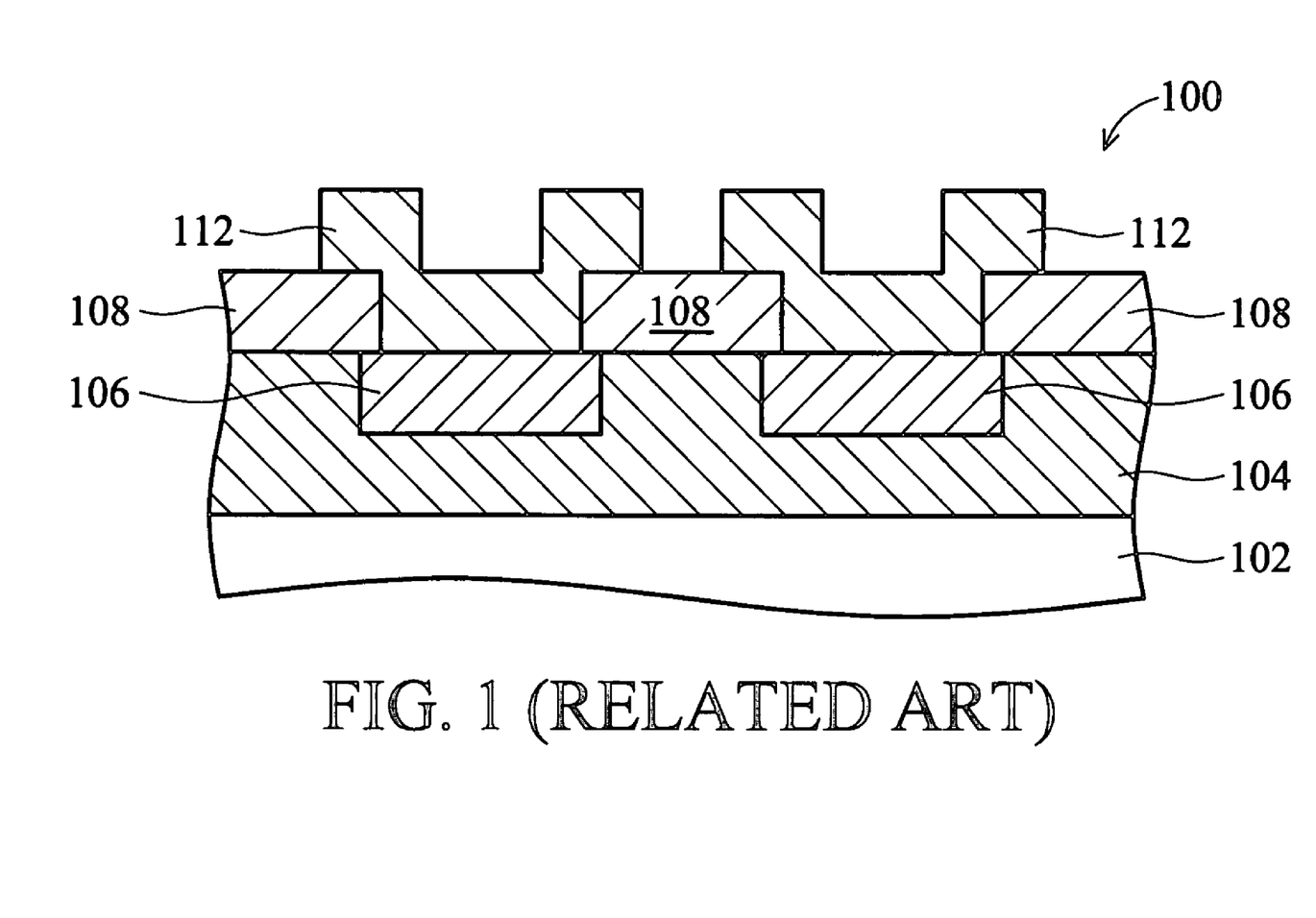
FIG. 1 shows a conventional bonding pad structure.

In order to facilitate the wire bonding process, typically a conventional integrated circuit 100 will have bond pads 112 formed at a top surface thereof, as shown in of FIG. 1. In the semiconductor device 100 shown, a substrate 102 having an insulating layer 104 formed at a top region thereof has a conductive region 106 or a plurality of conductive regions 106 formed within the insulating layer 104. The conductive regions 106 may comprise a pad of conductive material.

To form a bond pad 112, typically a passivation layer 108 is deposited over the insulating layer 104 and exposed portions of the conductive regions 106. The passivation layer 108 typically comprises a first layer comprised of plasma enhanced silicon nitride (PE-SiN).

The passivation layer 108 is patterned to expose a portion of the top surface of the conductive regions 106 using traditional photolithography and a photoresist (not shown), and a bond pad material 112 is deposited over the patterned passivation layer 108. The bond pad material 112 may conform to the underlying topography of the underlying patterned passivation layer 108, as shown. The bond pad material 112 is then patterned, also using traditional photolithography techniques and a photoresist (not shown), to form bond pads 112 that are electrically coupled to the underlying conductive regions 106. Wires may then be bonded to the bond pads 112 to electrically connect the semiconductor device 100 to a package or another semiconductor device or circuit, for example.

There is a trend in the semiconductor industry toward scaling or reducing the size of integrated circuits, as a result, the minimum feature size of integrated circuits is continually reduced. Thus, the wire bonding process for semiconductor devices more becomes more challenging. Therefore, what is needed in the art is to provide functioned circuit under the bonding pad to reduce space and increase integrity, and problems generated from circuit under the bonding pad is required to be solved.

BRIEF SUMMARY OF THE INVENTION

A detailed description is given in the following embodiments with reference to the accompanying drawings. These and other problems are generally solved or circumvented, and technical advantages are generally achieved, by preferred illustrative embodiments of the present invention, which provide a semiconductor bonding pad structure.

The invention provides a bonding pad structure. At least one lower circuit layer is disposed overlying the substrate, wherein the lower circuit layer is a layout of circuit under pad. A top circuit layer is disposed overlying the lower circuit layer, wherein the top circuit layer comprises a top interconnect dielectric layer and a top interconnect pattern in the top interconnect dielectric layer. A top connecting layer is disposed overlying the top circuit layer, electrically connecting the top interconnect pattern. A top pad layer is disposed overlying the top connecting layer. A bonding ball is disposed overlying the top pad layer, wherein sides of the top interconnect pattern do not overlap a region extending inwardly and outwardly from a boundary of the bonding ball within a distance of about 2.5 µm.

The invention provides a bonding pad structure of a circuit under pad. At least one lower circuit layer is disposed overlying the substrate. A top circuit layer is disposed overlying the lower circuit layer, wherein the top circuit layer comprises a top interconnect dielectric layer and a top interconnect pattern in the top interconnect dielectric layer, and no via is interposed between the top circuit layer and the lower circuit layer in the bonding pad structure. A top connecting layer is disposed overlying the top circuit layer, electrically connecting the top interconnect pattern. A top pad layer is disposed overlying the top connecting layer. A bonding ball is disposed overlying the top pad layer, wherein the top interconnect pattern is substantially a hallow pattern, the hallow pattern comprises an inter region within the boundary of the bonding ball by about 3 µm, or exceeding the boundary of the bonding ball by about 3 µm.

The invention provides a semiconductor chip. A primary device area is disposed at central portion of the semiconductor chip. A plurality of bonding pad structures is disposed on a periphery area of the chip. Each bonding pad structure comprises at least one lower circuit layer, wherein the lower circuit layer is a layout of circuit under pad. A top circuit layer overlies the lower circuit layer and comprises A top interconnect dielectric layer and a top interconnect pattern in the top interconnect dielectric layer. A top connecting layer overlies the top circuit layer, electrically connecting the top interconnect pattern. A top pad layer overlies the top connecting layer, and a bonding ball overlies the top pad layer. The sides of the top interconnect pattern do not overlap a region extending inwardly and outwardly from a boundary of the bonding ball within distance of about 2.5 µm.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention, which provides a organic light emitting device, will be described in greater detail by referring to the drawings that accompany the invention. It is noted that in the accompanying drawings, like and/or corresponding elements are referred to by like reference numerals.

A circuit under pad is a novel circuit design for a semiconductor device, in which the layout can be set directly under a top pad layer to reduce space and increase integrity.

In a conventional bonding pad structure, a plurality of vias are interposed between each two layers from a top pad layer to a lowest pad layer respectively. The pad structure is well constructed since each layer is connected with vias. Consequently, this pad structure is more stress resistant due to the vias between the layers.

Figure 2:
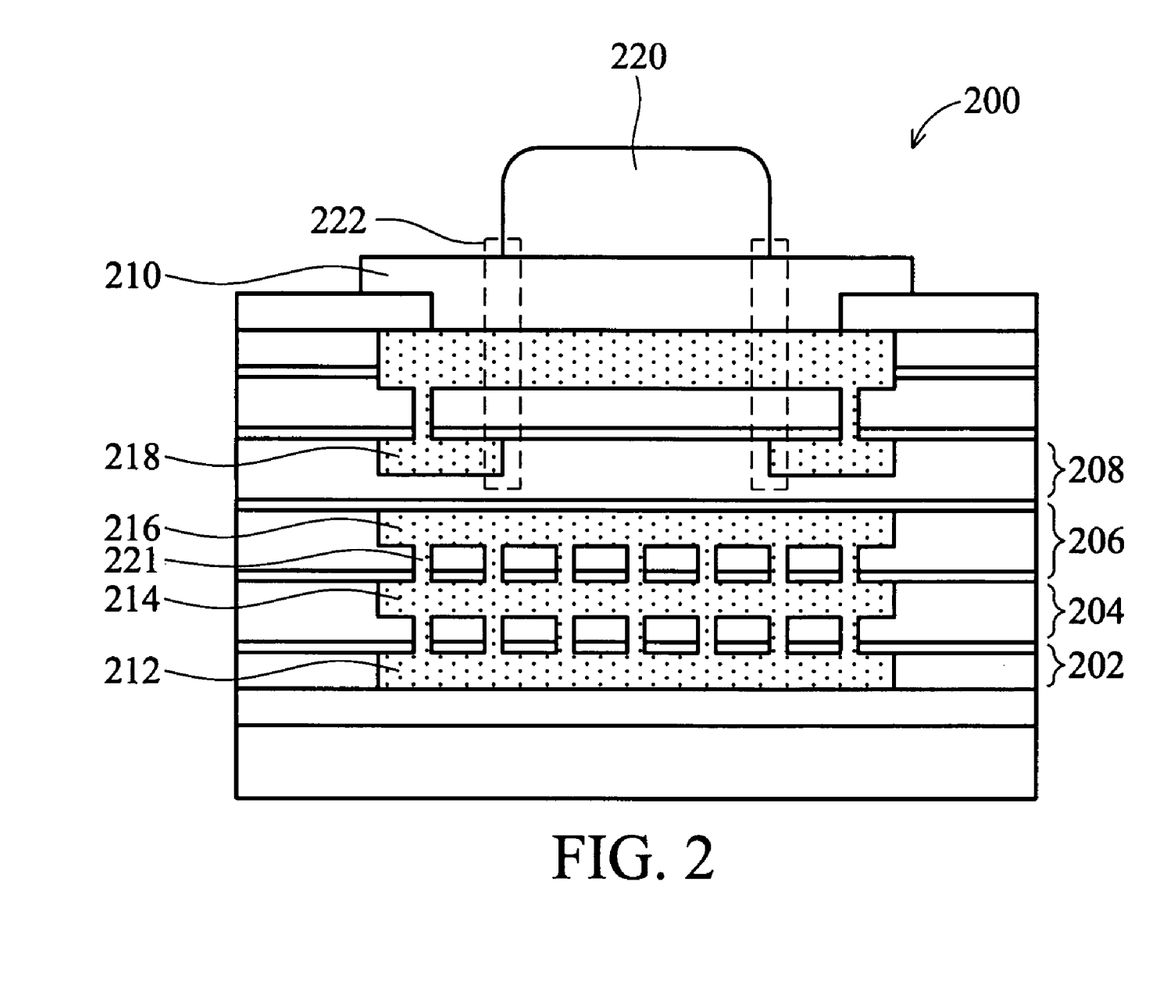
FIG. 2 shows a bonding pad structure of circuit under pad semiconductor device known to the inventor.

FIG. 2 shows a bonding pad structure 200 of the circuit under pad semiconductor device known to the inventor. This is not prior art for the purpose of determining the patentability of the present invention. This merely shows a problem found by the inventors. As shown in FIG. 2, a plurality of circuits of different layers 202, 204, 206 and 208 are disposed directly under a top pad layer 210. Interconnect metal layers 212, 214, 216 and 218 of the bonding pad structure of a circuit under pad semiconductor device are connected with fewer or no vias 221 under the top pad layer 210 to form circuit patterns. With fewer or no vias connecting each interconnect metal layers 212, 214, 216 and 218, the bonding pad structure 200, however, is less rigid than the conventional bonding pad structure. Thus, the poisson effect is likely to occur due to vertical stress from bonding force. Specifically, the area 222 neighboring to the bonding ball 220 is found to be a high stress area. Thus, poisson effect is more likely to occur when interconnect metal layers 212, 214, 216 and 218 are within the high stress area 222.

Figure 3A:
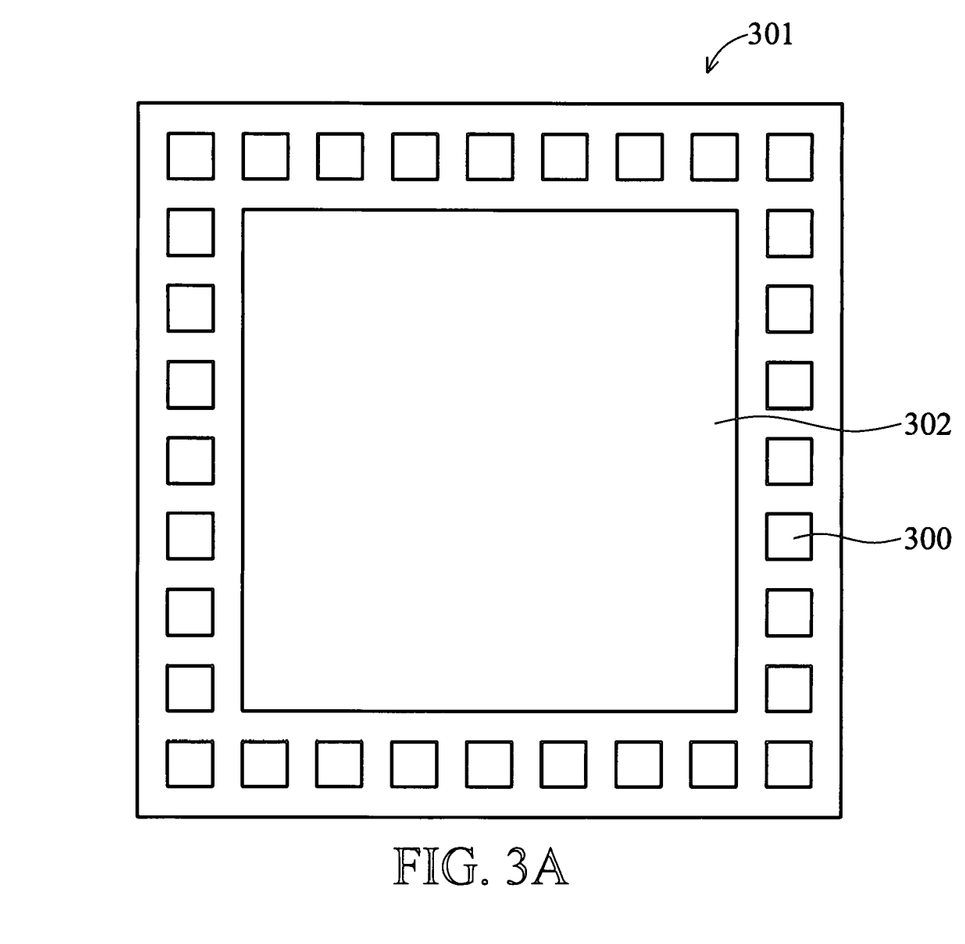
FIG. 3A shows a chip of a wafer of an embodiment of the invention.

FIG. 3A shows a chip 301 of a wafer, comprising a primary device area 302 and a plurality of bonding pad structures 300 on a periphery area of the chip 301, wherein the bonding pad structures 300 are circuit under pad structures, which can provide memory or logic functions.

Figure 3B:
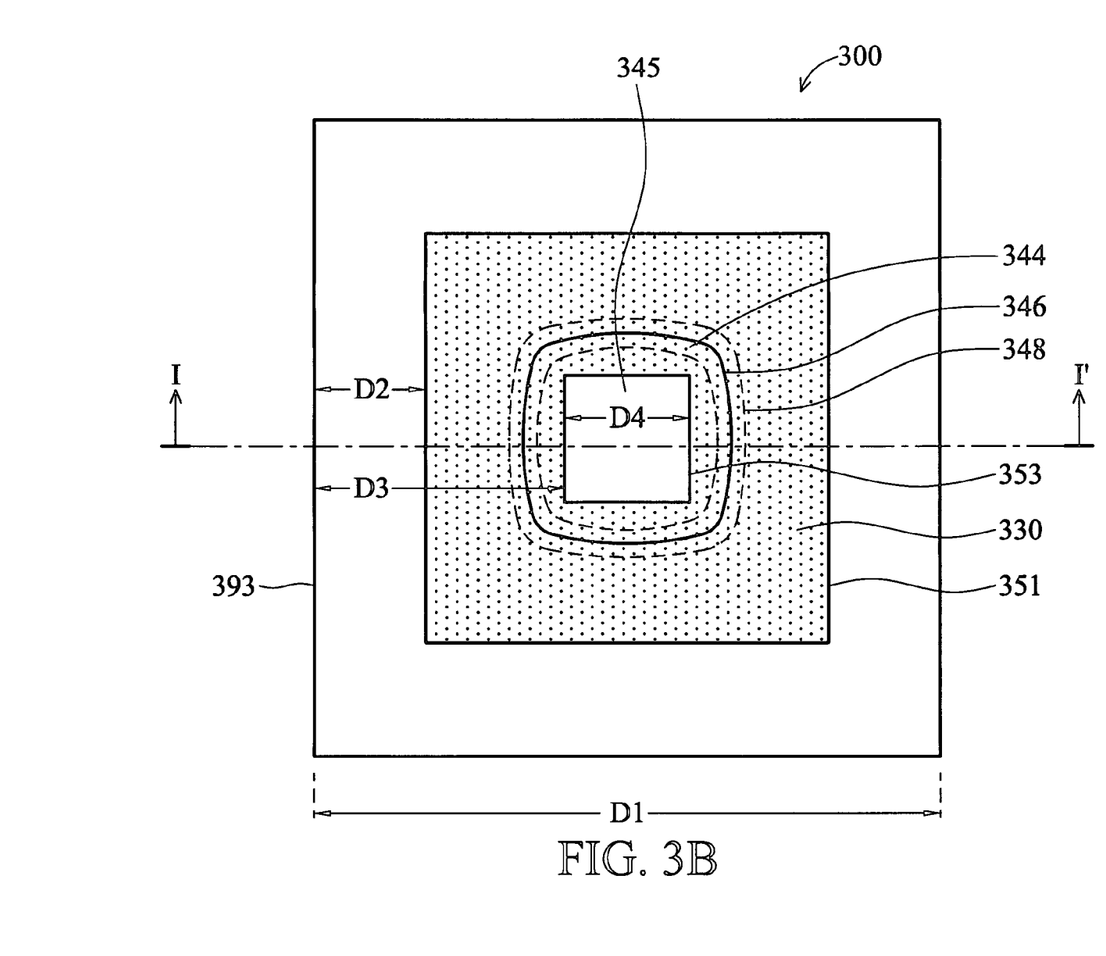
FIG. 3B shows a plan view of a bonding pad structure of an embodiment of the invention.
Figure 3C:
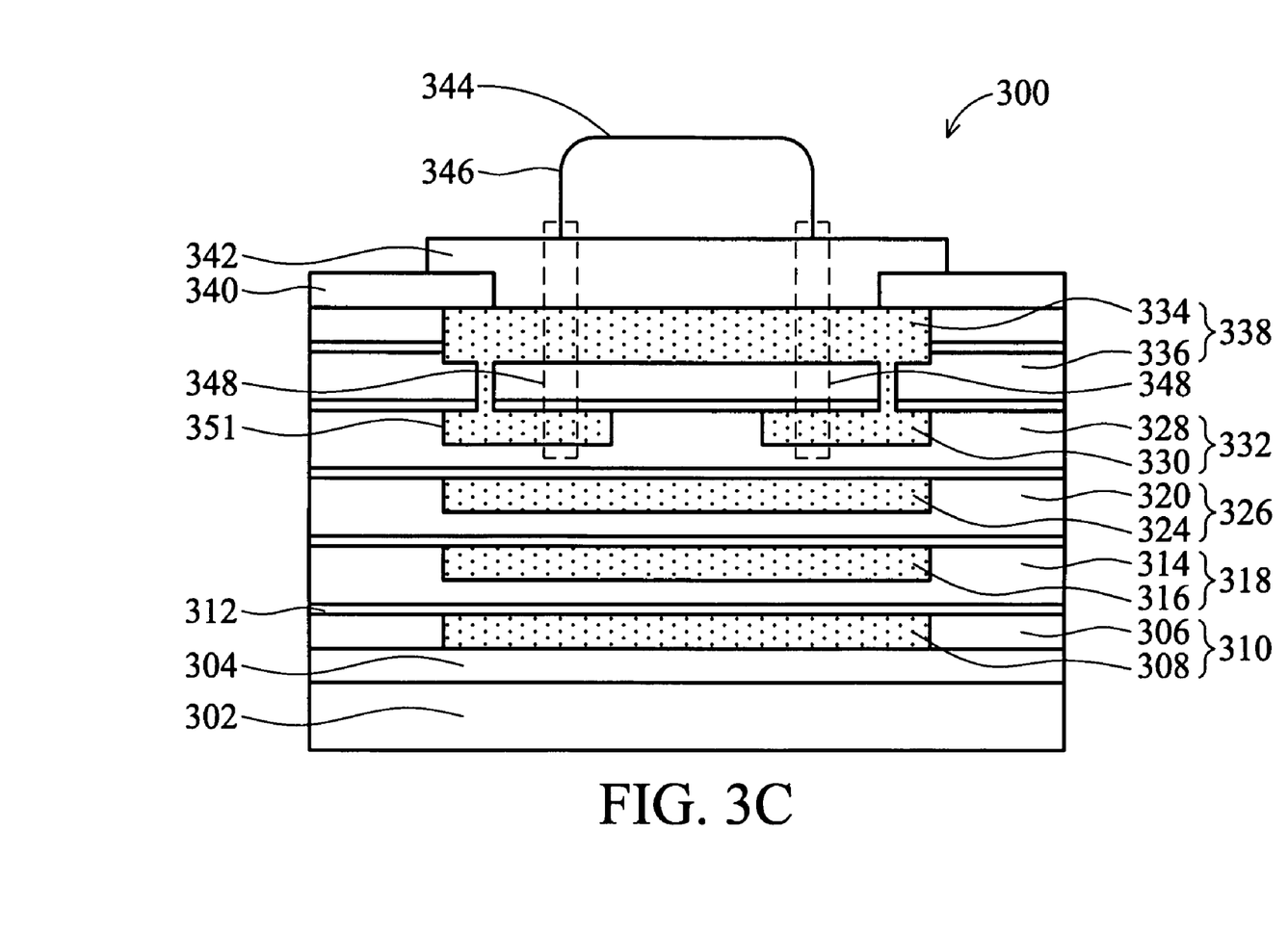
FIG. 3C is a cross section along line I-I' of FIG. 3B.

FIG. 3B is a top view of a bonding pad structure of an embodiment of the invention. FIG. 3C is a cross section along line I-I' of FIG. 3B. Referring to FIG. 3A, FIG. 3B and FIG. 3C, a substrate 302 is provided. The substrate 302 may include an elementary semiconductor, such as crystal silicon, amorphous silicon, and/or germanium; a compound semiconductor, such as silicon carbide and/or gallium arsenic; an alloy semiconductor, such as SiGe, GaAsP, AlInAs, and/or GaInP. Further, the substrate 302 may include a bulk semiconductor, such as bulk silicon, and such a bulk semiconductor may include an epi silicon layer. It may also or alternatively include a semiconductor-on-insulator substrate, such as silicon-on-insulator (SOI) substrate, or a thin-film-transistor substrate. The substrate 302 may also or alternatively include a multiple silicon structure or a multilayer compound semiconductor structure. Preferably, the substrate 302 is a silicon substrate.

Next, a buffer layer 304, such as phosphorous silicon glass PSG, is formed on the substrate 302. A first circuit layer 310 comprising a first interconnect dielectric layer 306 and a first interconnect conductive pattern 308 is formed on the buffer layer 304. The first circuit layer 310 can be formed by a metal patterning method or damascening method. In the metal patterning method, a first metal layer (not shown) is deposited on the buffer layer 304. The first metal layer can be Al or AlCu. The first metal layer is patterned by conventional lithography and etching to form the first interconnect conductive pattern 308. Thereafter, a dielectric material is deposited on the first interconnect conductive pattern 308 and the buffer layer 304 to form the first interconnect dielectric layer 306. The first interconnect dielectric layer 306 can be silicon oxide, silicon nitride or silicon oxynitride.

In a damascening method, a dielectric layer is formed on the buffer layer 304. The dielectric layer may be formed by CVD, PECVD, ALD, PVD, spin-on coating and/or other processes. The dielectric layer may include silicon dioxide, polyimide, spin-on-glass (SOG), fluoride-doped silicate glass (FSG). In one embodiment, the dielectric layer may include a low-k material having a dielectric constant k of less than about 3.3, such as Black Diamond (a product of Applied Materials of Santa Clara, Calif.), Xerogel, Aerogel, amorphous fluorinated carbon, and/or other materials. The dielectric layer is patterned by conventional technology to form a plurality of openings predetermined to form the first interconnect conductive pattern. Thereafter, a conductive material, such as W or Cu, is deposited on the first interconnect dielectric layer and fills the openings. The conductive material is polished by, for example, chemical mechanical polishing CMP, to form the first interconnect conductive pattern 308.

Next, a liner layer 312, such as silicon oxide, silicon nitride or silicon oxynitride, is formed on the first interconnect dielectric layer 306 and the first interconnect conductive pattern 308 for preventing diffusion.

Next, a second circuit layer 318 comprising a second interconnect dielectric layer 314 and a second interconnect conductive pattern 316 is formed overlying the first circuit layer 310. It is noticed that less or no vias are formed between the first and second circuit layers 310 and 318 of the pad structure 300. Vias may be formed beyond the pad structure 300. As well, the first and second interconnect conductive patterns 308 and 316 are not directly connected by a plurality of vias to directly supply current or voltage from a top pad layer to the lowest interconnect conductive pattern 308. The first and second circuit layers 310 and 318 function as circuit layouts, which may provide memory or logic functions, to reduce space and increase integrity.

Thereafter, a third circuit layer 326 comprising a third interconnect dielectric layer 320 and a third interconnect conductive pattern 324 is formed overlying the second circuit layer 318. A fourth circuit layer 332 comprising a fourth interconnect dielectric layer 328 and a fourth interconnect conductive pattern 330 is formed overlying the third circuit layer 332. In this embodiment of the invention, the fourth circuit layer 332 is a top circuit layer, comprising a top interconnect dielectric layer 328 and a top interconnect conductive pattern 330. It is noticed that only four circuit layers 310, 318, 326 and 332 are illustrated in the embodiment of the invention. The invention, however, is not limited thereto. The bonding pad structure 300 can comprise more or fewer circuit layers.

A top connecting layer 338 comprising a top conductive pattern 334 and a top dielectric layer 336 is formed on the top circuit layer 332. Formation of the top connecting layer 338, the top circuit layer 332, the third circuit layer 326 and the second circuit layer 318 can be achieved by the like method of forming the first circuit layer 310, and not illustrated for simplicity.

A passivation layer 340, such as silicon nitride or silicon oxynitride, is formed on the top connecting layer 338. A pad layer 342, such as Al, is formed on the top connecting layer 338 and the passivation layer 340. A bonding ball 344 is provided on the pad layer 342.

When bonding, an area extending inwardly and outwardly from a boundary 346 of the bonding ball 344 within distance of about 2.5 µm has high vertical stress. The area 348 having high stress can be referred to as a high stress area. Further, the top circuit layer 332 has higher stress than the other underlying circuit layers 326, 318 and 310. Consequently, in order to avoid the high stress area 348 of the bonding pad structure 300, edges 351 of the top conductive pattern 330 is prevented from substantially overlapping the high stress area 348.

Figure 3D:
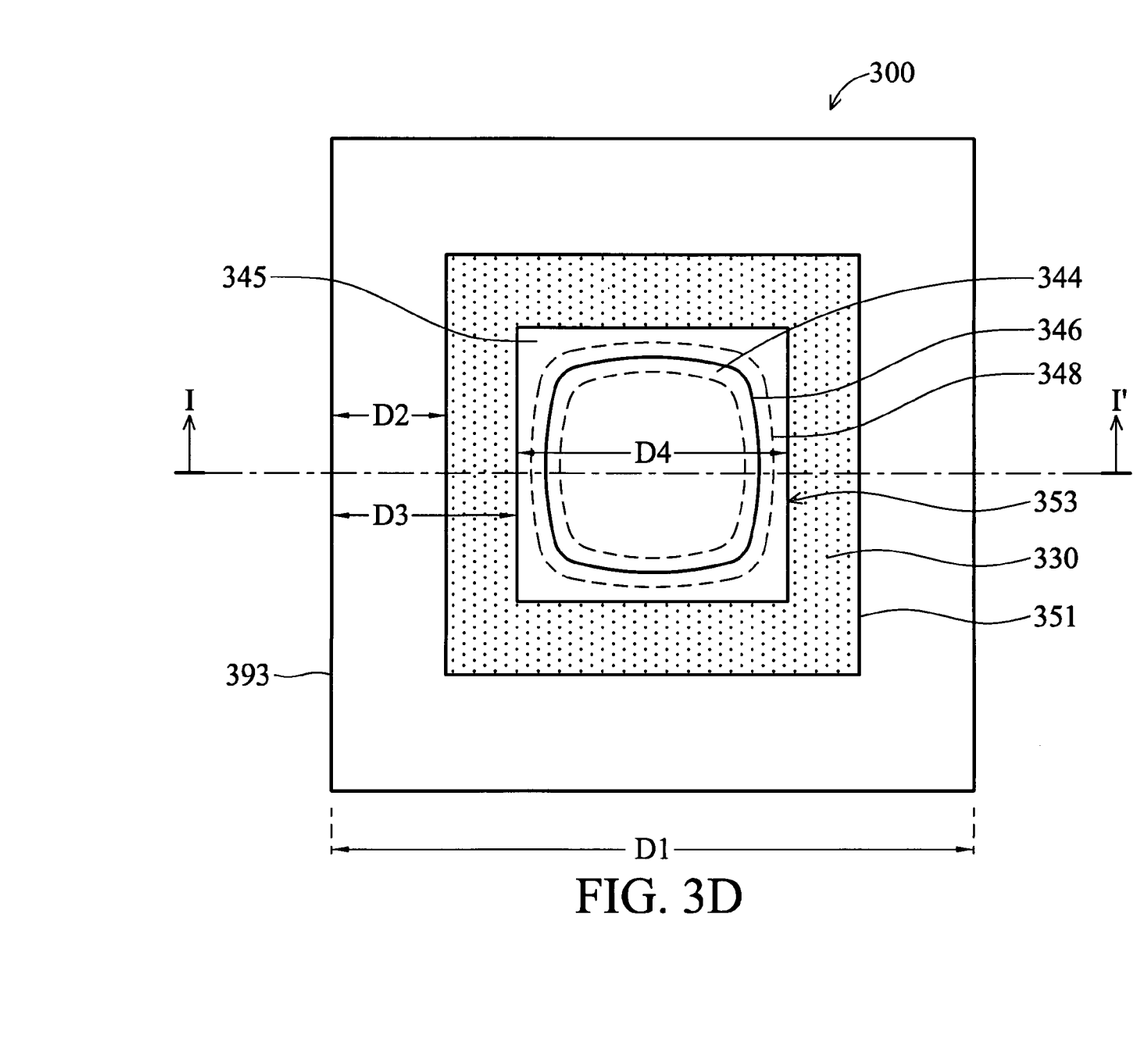
FIG. 3D shows a plan view of a bonding pad structure of another embodiment of the invention.
Figure 3E:
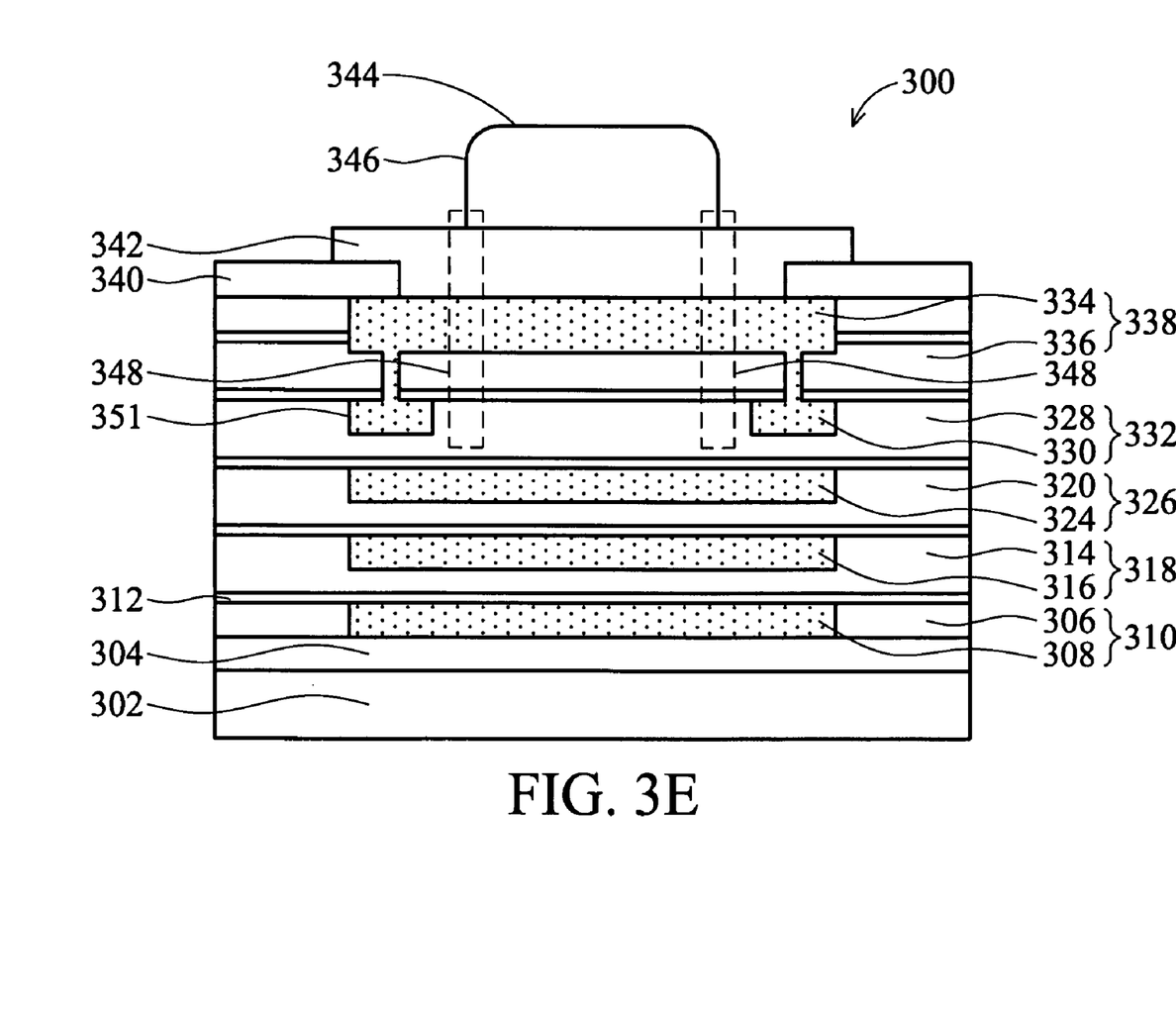
FIG. 3E is a cross section along line I-I' of FIG. 3D.

In an embodiment of the invention, the top conductive pattern 330 is a hollow pattern, such as a hollow square or a circle, wherein edge 351 of the hollow pattern 330 is not within the high stress area 348. More preferably, a inter region 345 of the hallow pattern 330 is within the boundary of the bonding ball 344 by about 3 µm, as shown in FIG. 3B. Alternatively, as shown in FIG. 3D and FIG. 3E, a inter region 345 of the hallow pattern 330 exceeds the boundary of the bonding ball 344 by about 3 µm, as shown in FIG. 3D and FIG. 3E.

Referring to FIG. 3B, in an example of the invention, the bonding pad structure 300 comprises a square area with side length D1 of about 50 µm, and the bonding ball 344 has a diameter of about 40 µm. Preferably, a distance D2 between one side 393 of the bonding pad structure 300 and an outer side of the hollow square 330 is less than about 3 µm, and another distance D3 between the side 393 the bonding pad structure 300 and an inner side 353 of the hollow square 330 is more than about 8 µm. As well, in order to avoid the high stress region, a ratio of the horizontal length D4 of the inter region 345 of the hallow pattern 330 to the horizontal length D1 of a side of the bonding pad structure 300 is preferably not in the range of about 0.7~0.9. The ratio can be less than 0.7, or more than 0.9, as shown in FIG. 3B.

Figure 4:
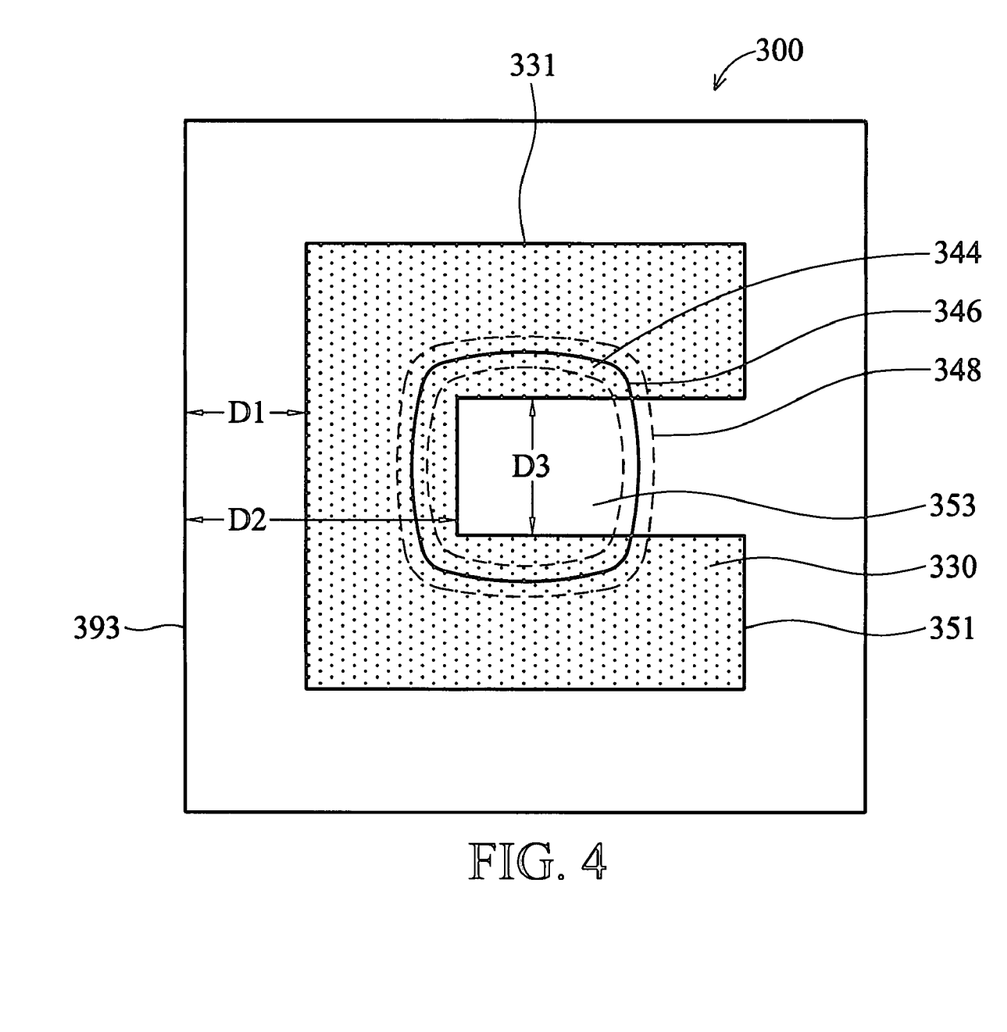
FIG. 4 shows a top view of a bonding pad structure of further another embodiment of the invention.

The top connecting layer 338, however, is not limited to the hollow pattern 330 described. The top connecting layer 338 can be any pattern with sides substantially not overlapping the high stress region 348. For example, as shown in FIG. 4, the top interconnect conductive pattern 330 can be a U shape pattern with sides 331 substantially not overlapping the high stress region 348. Taking an example, the bonding pad structure 300 comprises a square area with side length D1 of about 50 µm. The bonding ball 344 has a diameter of about 40 µm. A distance D1 between one side 393 of the bonding pad structure 300 and an outer side 331 of the U shape pattern 330 is less than about 3 µm. Another distance D2 between the side 393 of the bonding pad structure 300 and an inner side of the U shape pattern 330 is more than about 8 µm. As well, in order to avoid the high stress region 348, a ratio of the horizontal length D3 of between two opposite adjacent inner sides of the U shape pattern 330 to the horizontal length D1 of a side of the plane area of the bonding pad structure 300 is preferably not in the range of about 0.7~0.9. Preferably, the ratio is less than 0.7 or more than 0.9.

Figure 5:
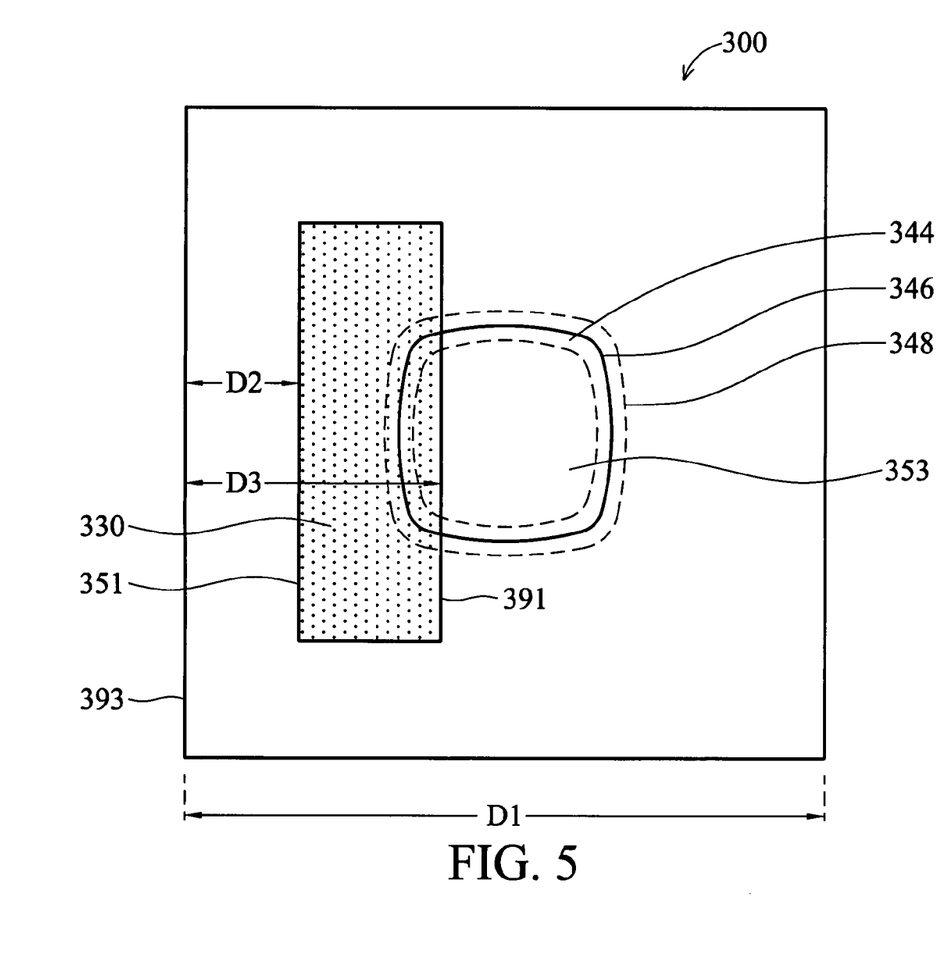
FIG. 5 shows a top view of a bonding pad structure of yet another embodiment of the invention.

The top interconnect conductive pattern 330 can also be a solid square with sides substantially not overlapping the high stress region 348. For example, as shown in FIG. 5, the bonding pad structure 300 is a square with side length D1 of about 50 µm. The bonding ball 344 has a diameter of about 40 µm. A distance D2 between one side 393 of the bonding pad structure 300 and a first side of the square pattern 330 is less than about 3 µm. Another distance D3 between the side 393 of bonding pad structure 300 and a second side 391 of the square pattern 330 is more than about 8 µm.

According a feature of an embodiment of the invention, the side of the top interconnect conductive pattern 330 does not substantially overlap the high stress region 348, a region extending inwardly from boundary of the bonding ball of about 2.5 µm, and outwardly from boundary of the bonding ball of about 2.5 µm. Consequently, according an embodiment of the invention, the poisson effect of the bonding pad structure 300 during wire bonding could be eliminated. In addition, the poisson effect of the bonding pad structure during a wire pulling test could also be eliminated.

While the invention has been described by way of example and in terms of the preferred embodiments, it is to be understood that the invention is not limited to the disclosed embodiments. Specifically, the hallow area is not limited to a circular, square or rectangular shape, but any kind of hallow shape. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bonding pad structure, comprising:
   a substrate;
   at least one lower circuit layer overlying the substrate, wherein the lower circuit layer is a layout of a circuit under pad;
   a top circuit layer overlying the lower circuit layer, wherein the top circuit layer comprises a top interconnect dielectric layer and a top interconnect pattern in the top interconnect dielectric layer;
   a top connecting layer overlying the top circuit layer, electrically connecting the top interconnect pattern;
   a top pad layer overlying the top connecting layer; and
   a bonding ball overlying the top pad layer,
   wherein sides of the top interconnect pattern do not overlap a region extending inwardly and outwardly from a boundary of the bonding ball within distance of about 2.5 µm.

2. The bonding pad structure as claimed in claim 1, wherein the top interconnect pattern is a hallow pattern, and a ratio of the horizontal length of an inter region of the hallow pattern to a horizontal length of a side of a plane area of the bonding pad structure is less than about 0.7 and more than about 0.9.

3. The bonding pad structure as claimed in claim 2, wherein the hallow pattern is a hallow square, or a circle.

4. The bonding pad structure as claimed in claim 1, wherein the top interconnect pattern is a U shape pattern, and a ratio of the horizontal length between two inner sides of the U shape pattern to the horizontal length of a side of the plane area of the bonding pad structure is not between 0.7~0.9.

5. The bonding pad structure as claimed in claim 1, wherein the top interconnect pattern is a solid pattern.

6. The bonding pad structure as claimed in claim 1, wherein the top interconnect pattern is a hallow pattern, and an inter region of the hallow pattern is within the bonding ball boundary by about 3 μm, or exceeding the bonding ball boundary by about 3 μm.

7. The bonding pad structure as claimed in claim 1, wherein no via is interposed between the top circuit layer and the lower circuit layer.

8. The bonding pad structure as claimed in claim 1, wherein the at least one lower circuit layer comprises a plurality of lower circuit layers, and each two circuit layers are not connected within an area directly under the bonding pad.

9. The bonding pad structure as claimed in claim 1, further comprising:
a buffer layer between the substrate and the at least one lower circuit layer; and
a passivation covering a portion of the top pad layer.

10. The bonding pad structure as claimed in claim 1, wherein the lower circuit layer has logic or memory function.

11. A bonding pad structure, comprising:
a substrate;
at least one lower circuit layer overlying the substrate, wherein the lower circuit layer is a layout of circuit under pad;
a top circuit layer overlying the lower circuit layer, wherein the top circuit layer comprises a top interconnect dielectric layer and a top interconnect pattern in the top interconnect dielectric layer;
a top connecting layer overlying the top circuit layer, electrically connecting the top interconnect pattern; and
a top pad layer overlying the top connecting layer;
a bonding ball overlying the top pad layer,
wherein the top interconnect pattern is substantially a hallow pattern, the hallow pattern comprises an inter region, the inter region is within boundary of the bonding ball by about 3 μm, or exceeding boundary of the bonding ball by about 3 μm.

12. The bonding pad structure as claimed in claim 11, wherein the hallow pattern is a hallow square, or a circle.

13. The bonding pad structure as claimed in claim 11, wherein a ratio of the horizontal length of an inter region of the hallow pattern to a horizontal length of a side of a plane area of the bonding pad structure is less than about 0.7 and more than about 0.9.

14. The bonding pad structure as claimed in claim 11, wherein the at least one lower circuit layer comprises a plurality of circuit layers, and each circuit layer is not connected with a via within a area directly under the bonding pad.

15. A semiconductor chip, comprising:
a primary device area at central portion of the semiconductor chip;
a plurality of bonding pad structures on a periphery area of the chip, wherein each bonding pad structure comprises:
at least one lower circuit layer, wherein the lower circuit layer is a layout of circuit under pad;
a top circuit layer overlying the lower circuit layer, wherein the top circuit layer comprises a top interconnect dielectric layer and a top interconnect pattern in the top interconnect dielectric layer;
a top connecting layer overlying the top circuit layer, electrically connecting the top interconnect pattern;
a top pad layer overlying the top connecting layer; and
a bonding ball overlying the top pad layer,
wherein sides of the top interconnect pattern do not overlap a region extending inwardly and outwardly from a boundary of the bonding ball within distance of about 2.5 μm.

16. The bonding pad structure as claimed in claim 15, wherein no via is interposed between the top circuit layer and the lower circuit layer.

17. The semiconductor chip as claimed in claim 15, wherein the top interconnect pattern is a hallow pattern, and a ratio of the horizontal length of an inter region of the hallow pattern to a horizontal length of a side of a plane area of the bonding pad structure is less than about 0.7 and more than about 0.9.

18. The semiconductor chip as claimed in claim 15, wherein the top interconnect pattern is a hallow pattern, and an inter region of the hallow pattern is within boundary of the bonding ball by about 3 μm, or exceeding the boundary of the bonding ball by about 3 μm.

19. The semiconductor chip as claimed in claim 15, wherein no via is interposed between the top circuit layer and the lower circuit layer.

20. The semiconductor chip as claimed in claim 15, wherein the top interconnect pattern is a U shape pattern, and a ratio of the horizontal length of between two inner sides of the U shape pattern to the horizontal length of a side of the plane area of the bonding pad structure is substantially not between 0.7~0.9.

* * * * *